(12) United States Patent
Rikimaru et al.

(10) Patent No.: US 7,866,986 B2
(45) Date of Patent: Jan. 11, 2011

(54) CONDUCTIVE CONTACT UNIT AND CONDUCTIVE CONTACT

(75) Inventors: Taiichi Rikimaru, Kanagawa (JP); Koji Ishikawa, Kanagawa (JP); Jun Tominaga, Kanagawa (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 0 days.

(21) Appl. No.: 12/085,170

(22) PCT Filed: Nov. 21, 2006

(86) PCT No.: PCT/JP2006/323195

§ 371 (c)(1),
(2), (4) Date: May 20, 2009

(87) PCT Pub. No.: WO2007/060939

PCT Pub. Date: May 31, 2007

(65) Prior Publication Data

US 2009/0298307 A1 Dec. 3, 2009

(30) Foreign Application Priority Data

Nov. 22, 2005 (JP) .............................. 2005-337212

(51) Int. Cl.
H01R 12/00 (2006.01)
(52) U.S. Cl. ......................................... 439/65; 439/862
(58) Field of Classification Search .................... 439/65, 439/66, 74, 700, 862
See application file for complete search history.

(56) References Cited

U.S. PATENT DOCUMENTS 4,773,877 A * 9/1988 Kruger et al. ............... 439/482

6,083,059 A * 7/2000 Kuan ........................... 439/862
7,179,133 B2 * 2/2007 Forell et al. ................. 439/700

(Continued)

FOREIGN PATENT DOCUMENTS

CN 1682414A A 10/2005

(Continued)

OTHER PUBLICATIONS

International Search Report dated Mar. 6, 2007, issued in PCT/JP2006/323195.

(Continued)

*Primary Examiner*—Thanh-Tam T Le
(74) *Attorney, Agent, or Firm*—Edwards Angell Palmer & Dodge LLP

(57) ABSTRACT

A conductive contact unit includes plate-like conductive contacts for electrically connecting different circuitries. Each conductive contact includes a first contacting element to be brought in physical contact with one circuitry, a second contacting element to be brought in physical contact with another circuitry, an elastic element, between the first contacting element and the second contacting element, a first connecting element that connects the elastic element and the first contacting element, and a second connecting element that connects the elastic element and the second contacting element and that has an opening. The conductive contact unit also includes a conductive contact holder including first guiding grooves and second guiding grooves facing the first guiding grooves. The conductive contact holder holds the conductive contacts with both longitudinal outside ends of each conductive contact being slidably engaged with the first and the second guiding grooves.

4 Claims, 9 Drawing Sheets

U.S. PATENT DOCUMENTS

| | | | |
|---|---|---|---|
| 7,291,020 B2 * | 11/2007 | Soh | 439/66 |
| 7,335,068 B2 * | 2/2008 | Dwan et al. | 439/700 |
| 7,361,023 B2 * | 4/2008 | Wu | 439/66 |
| 7,494,346 B1 * | 2/2009 | Peng | 439/74 |
| 2006/0183357 A1 | 8/2006 | Soh | |

FOREIGN PATENT DOCUMENTS

| | | |
|---|---|---|
| JP | 11-133060 | 5/1999 |
| JP | 2000-046870 | 2/2000 |
| JP | 2001-324515 | 11/2001 |
| JP | 2001-343397 | 12/2001 |

OTHER PUBLICATIONS

Office Action dated Oct. 22, 2010, for Taiwanese Patent Application No,.095143141.

* cited by examiner

CONDUCTIVE CONTACT UNIT AND CONDUCTIVE CONTACT

BACKGROUND OF THE INVENTION

1. Field of the Invention

The present invention relates to a conductive contact unit and a conductive contact that are brought into contact with an electrode or a terminal that transmits and receives an electrical signal upon testing a conductive state or testing operating characteristics of an electronic component such as a liquid crystal panel or a semiconductor integrated circuit.

2. Description of Related Art

In a technological field of electrical characteristic testing of a test object such as a semiconductor integrated circuit, there is a known technology related to a conductive contact unit. The conductive contact unit includes a plurality of conductive contacts, each of which is arranged correspondingly to a connecting terminal of the semiconductor integrated circuit, and provides electrical conductivity by bringing the conductive contacts into physical contact with the connecting terminals. A structure of the conductive contact includes at least the conductive contacts and a conductive contact holder for holding the conductive contacts. Along with a trend to miniaturize the semiconductor integrated circuit that is a test object, various technologies have been suggested for the conductive contact unit to narrow the intervals between the arranged conductive contacts so that smaller intervals of connecting terminal arrangement can be accommodated.

As one of the examples of the conductive contacts that achieve narrower arrangement intervals, there has been suggested a plate-shaped conductive member structure that is integrated with a contacting element that is brought into contact with the test object, and an elastic element that urges a snapping force to the contacting element. By arranging the plate-like conductive contacts in a through-thickness direction, it becomes theoretically possible, according to this technology, to arrange a number of conductive contacts in a small space. In this manner, a conductive contact that can support the narrower arrangement intervals of the connecting terminals of the test object can be achieved. (For example, see Patent Document 1 listed below.)

[Patent Document 1] Japanese Patent Application Laid-open Number 2001-343397

The structure of the known conductive contact unit having the plate-like conductive contacts includes a conductive contact holder with guiding holes formed thereon for containing the conductive contacts. In this structure, the intervals of the arranged conductive contacts are defined by intervals between the guiding holes that are provided correspondingly to the number of the conductive contacts. However, minimum possible intervals thereof are limited by several conditions, such as physical strength of the conductive contact holder on which these guiding holes are formed. Therefore, even though the conductive contacts themselves have a structure suitable for smaller arrangement intervals, not sufficient devices have been suggested for the structure of the conductive contact holder. Therefore, considering the conductive contact unit as a whole, it has been sometimes difficult to reduce the arrangement intervals of the conductive contacts.

Upon performing a test using the known conductive contact unit, it is preferable for an operator using the conductive contact unit to be able to visually check the contact between the tip of the conductive contact and the test object. However, in the known conductive contact unit, when the conductive contact is looked down from the top, lower tip of the conductive contact is positioned inside a side wall of the conductive contact holder. Therefore, to observe the contact between the tip area of the conductive contact and the test object, the operator needed to bend over and look into the contact area. This leads to an increased physical burden to the operator when the greater number of times the test is performed.

Furthermore, in the known conductive contact unit, the tip of the conductive contact makes a stroke in a direction substantially in parallel with the direction in which the elastic bodies are extended. Therefore, it has been impossible to sufficiently remove an oxidized film formed on the surface of the test object, or dust attached thereon. Therefore, it has been sometimes impossible to obtain a stable electric contact. In such a situation, an excessive load could be applied onto the conductive contacts.

BRIEF SUMMARY OF THE INVENTION

The present invention is invented in consideration of the above. An object of the present invention is to provide a conductive contact unit and a conductive contact that can support the smaller arrangement intervals, that enables the operator to look at the contact of the test object easily from the top, and that can achieve a stable electrical contact without applying the excessive load.

According to an aspect of the present invention, a conductive contact unit includes a plurality of plate-like conductive contacts for electrically connecting different circuitries, each conductive contact including a first contacting element to be brought in physical contact with one circuitry, a second contacting element to be brought in physical contact with another circuitry, an elastic element that is between the first contacting element and the second contacting element and is extensible in a longitudinal direction thereof, a first connecting element that connects the elastic element and the first contacting element, and a second connecting element that connects the elastic element and the second contacting element and that has an opening penetrating therethrough in a thickness direction, a conductive contact holder including a plurality of first guiding grooves and a plurality of the second guiding grooves facing the first guiding grooves, the conductive contact holder holding the conductive contacts with both longitudinal outside ends of each conductive contact being slidably engaged with the first guiding groove and the second guiding groove, the second connecting element of the conductive contact protecting from a bottom end of the second guiding groove toward outside of the conductive contact holder; a bar-shaped member that penetrates through the openings of the respective second connecting elements of the conductive contacts, and is fixed onto the conductive contact holder.

According to the conductive contact unit, at least a part of the second contacting element may project from an external surface of a side wall of the conductive contact holder in a normal direction of the external surface, the first guiding grooves being formed inside of the side wall.

According to the conductive contact unit, a direction of a load, applied to the second contacting element when the second contacting element is brought into physical contact with any one of the different circuitries, may intersect a direction in which the first guiding grooves and the second guiding grooves extend.

According to the conductive contact unit, a cross-sectional area of the bar-shaped member, sectioned in perpendicular to a longitudinal direction thereof, may be smaller than an area of the opening formed on the conductive contact.

According to another aspect of the present invention, a conductive contact for electrically connecting different circuitries includes a first contacting element to be brought into physical contact with one circuitry; a second contacting element to be brought into physical contact with another circuitry; an elastic element that is between the first contacting element and the second contacting element, and is extensible in a longitudinal direction; a first connecting element that connects the elastic element and the first contacting element; and a second connecting element that connects the elastic element and the second contacting element and has an opening penetrating therethrough in a thickness direction, wherein the second contacting element projects from a width-direction outside end of the second connecting element in the width direction.

According to the present invention, provided with are a conductive contact holder including a plurality of first guiding grooves and a plurality of the second guiding grooves facing the first guiding grooves, the first guiding grooves being engaged with one longitudinal outside ends of the conductive contacts to hold the conductive contacts in a slidable manner, respectively, and the second guiding grooves being engaged with outside ends other than the outside ends of the conductive contacts engaged with the first guiding grooves to hold the conductive contacts in a slidable manner, respectively; a plurality of such plate-like conductive contacts, each of which including a first contacting element that is brought in physical contact with one of the different circuitries, a second contacting element that is brought into physical contact with one of the different circuitries other than that brought into contact with the first contacting element, an elastic element that is interposed between the first contacting element and the second contacting element and is extensible in a longitudinal direction thereof, a first connecting element that connects the elastic element and the first contacting element, and a second connecting element that connects the elastic element and the second contacting element, that has an opening penetrating therethrough in a thickness direction, and that projects from ends of the second guiding grooves toward outside of the conductive contact holder when being held inside the conductive contact holder; and a bar-shaped member that penetrates through the openings formed on the respective second connecting elements of the conductive contacts, and is fixed onto the conductive contact holder. In this manner, the narrower arrangement intervals can be supported, and the contact with the test object can be visually checked from the top easily. Moreover, a stable electrical contact can be achieved without applying an excessive load.

According to the present invention, provided are a first contacting element that is brought into physical contact with one of the different circuitries; a second contacting element that is brought into physical contact with one of the different circuitries other than that brought into contact with the first contacting element; an elastic element that is interposed between the first contacting element and the second contacting element, and is extensible in a longitudinal direction; a first connecting element that connects the elastic element and the first contacting element; and a second connecting element that connects the elastic element and the second contacting element and has an opening penetrating therethrough in a thickness direction, and the second contacting element projects from a width-direction outside end of the second connecting element in the width direction. In this manner, the smaller arrangement intervals can be supported, and the contact with the test object can be visually checked from the top easily, when the conductive contact is held in the conductive contact holder. Moreover, a stable electrical contact can be achieved without applying an excessive load.

BRIEF DESCRIPTION OF THE SEVERAL VIEWS OF THE DRAWINGS

FIG. 6-1 is a diagram of the conductive contact unit according to the first embodiment immediately after being brought into contact with a test object.

FIG. 6-2 is a diagram of the conductive contact unit according to the first embodiment with the test object elevated to a test position.

Figure 1:
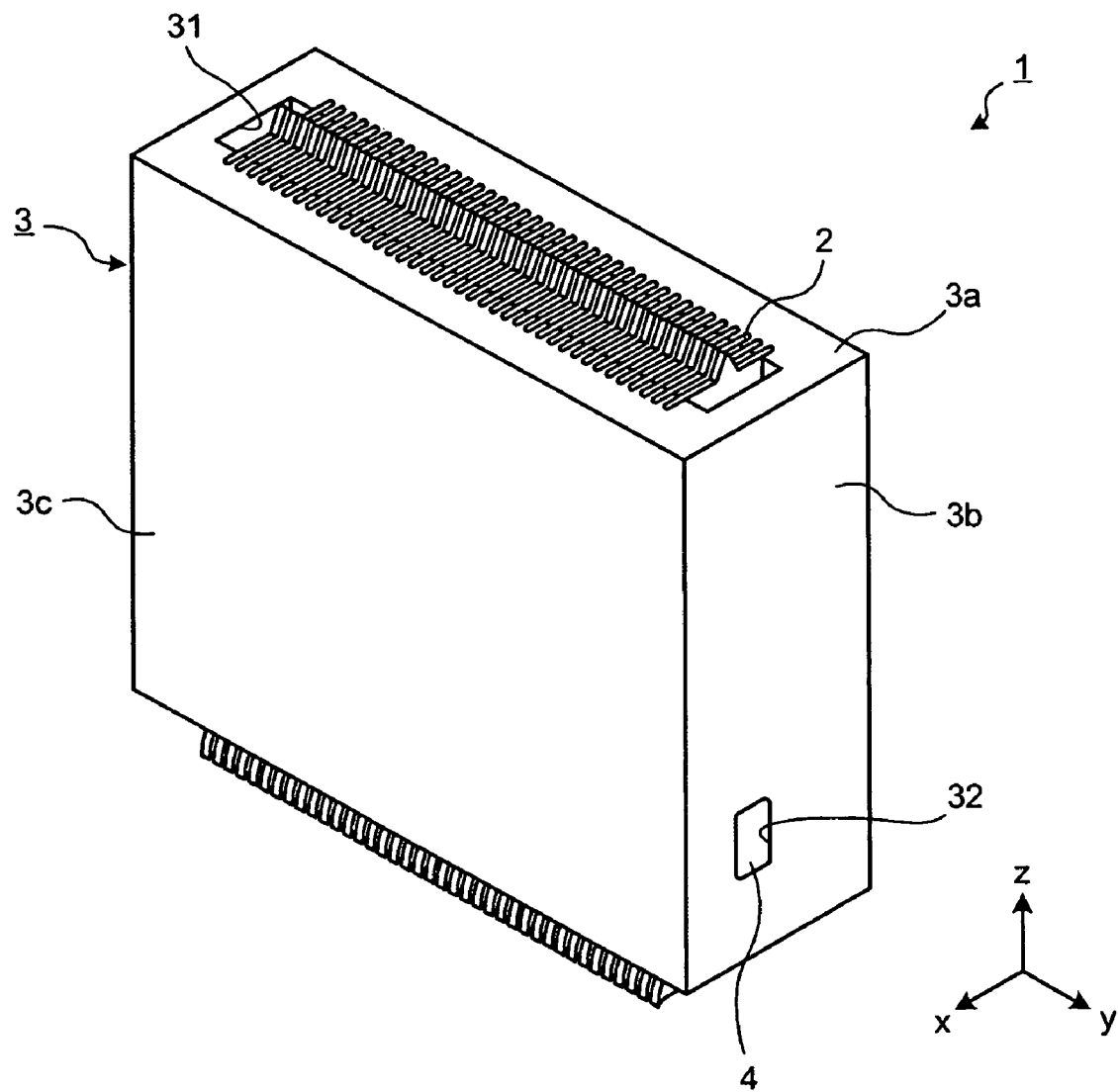
FIG. 1 is a perspective view of a structure of a conductive contact unit according to a first embodiment of the present invention.

EXPLANATIONS OF LETTERS OR NUMERALS 1, 10 conductive contact unit
2, 5 conductive contact
3, 6 conductive contact holder
3a, 6a upper wall
3b, 3c, 6c side wall
3d, 6d bottom wall
4, 7 bar-shaped member
21, 51 first contacting element
22, 52 second contacting element
23, 53 elastic element
24, 54 first connecting element
25, 55 second connecting element
26, 56 opening
31, 61 supporting element
32 fastening hole
31a, 61a first guiding groove
31b, 61b second guiding groove
100 circuit substrate
101 fixing member
200, 300 test object
P1, P3 initial contacting point
P2, P4 final contacting point
Δ1 offset
δ1, δ2, h projected length

DETAILED DESCRIPTION OF EXEMPLARY EMBODIMENTS

Exemplary embodiments for carrying out the present invention (hereinafter, "embodiments") will be now explained with reference to the attached drawings. It should be noted that the drawings are just schematic representations, and that the relationship between a thickness and a width of each element, or a thickness ratio of each element may be different from those actually measured. Moreover, it should be obvious that a relationship or a ratio of dimensions might be different in each of the drawings.

First Embodiment

FIG. 1 is a perspective view of a structure of a conductive contact unit according to a first embodiment of the present invention. A conductive contact unit 1, shown in FIG. 1, is used for testing the conductive state or operating characteristics of testing a circuitry, such as a liquid crystal panel that is a test object. The conductive contact unit 1 includes a plurality of conductive contacts 2, a conductive contact holder 3 that contains the conductive contacts 2, and a bar-shaped member 4 that is fastened to the conductive contact holder 3 and supports the conductive contacts 2.

Figure 2:
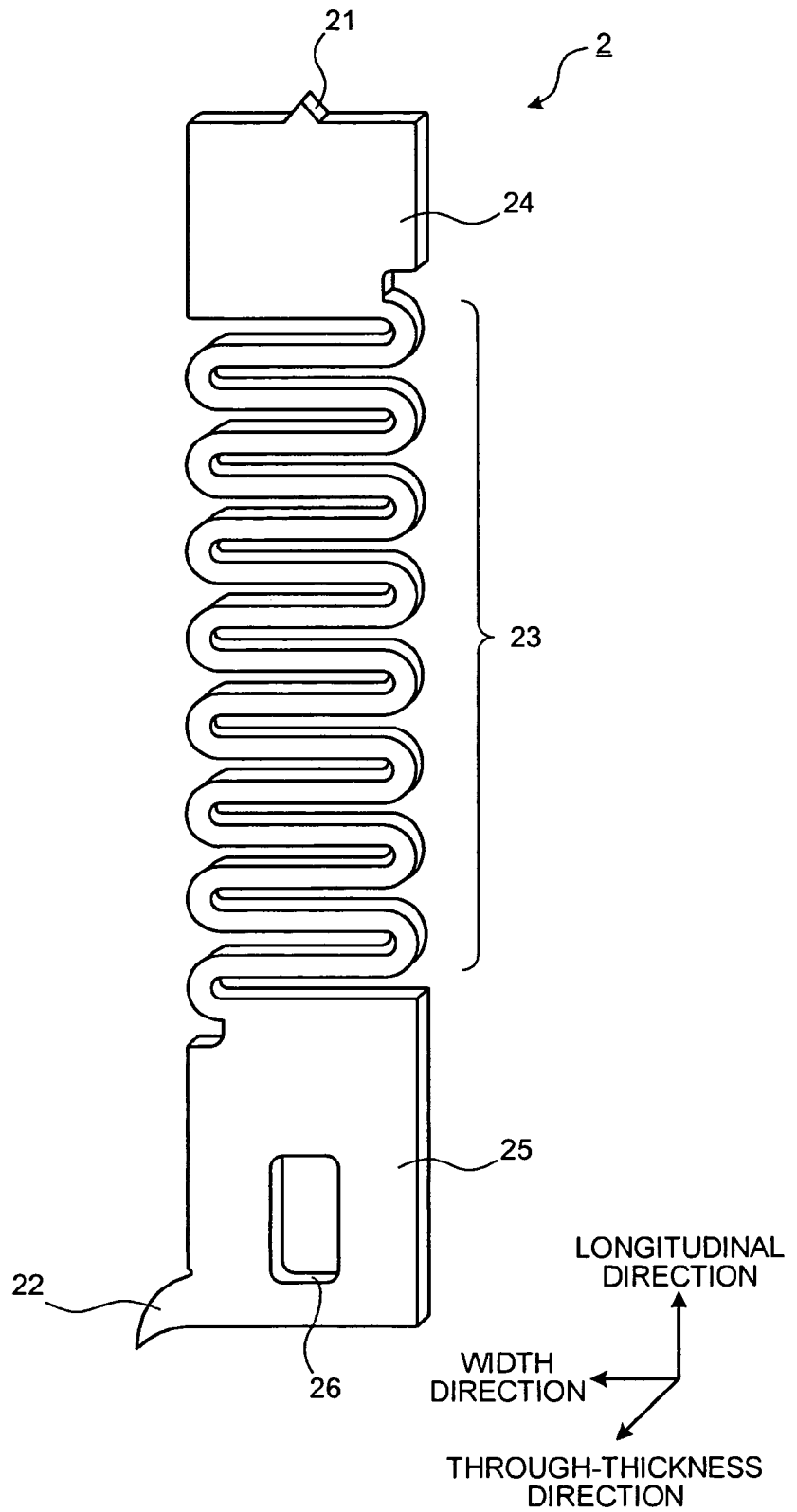
FIG. 2 is a diagram of a structure of a conductive contact according to the first embodiment.

The conductive contact 2 will be now explained in detail. FIG. 2 is a diagram of a structure of the conductive contact 2 according to the first embodiment. In the following description, the vertical direction in FIG. 2 will be referred to as a "longitudinal direction of the conductive contact 2", the horizontal direction in FIG. 2 will be referred to as a "width direction of the conductive contact 2", and the direction intersecting with the longitudinal direction and the width direction will be referred to as a "through-thickness (thickness) direction of the conductive contact 2", respectively.

The conductive contact 2 shown in FIG. 2 is provided to establish an electrical connection between different circuitries. The conductive contact 2 includes: a first contacting element 21 that is brought into physical contact with a pre-determined circuitry (specifically, a circuitry having a test circuit); a second contacting element 22 that is brought into physical contact with a circuitry other than that brought into contact with the first contacting element 21 (specifically, a test object such as a liquid crystal display); an elastic element 23 that is interposed between the first contacting element 21 and the second contacting element 22, and is extensible in the longitudinal direction; a first connecting element 24 having the same width and thickness as the elastic element 23, and connecting the first contacting element 21 and the elastic element 23; and a second connecting element 25 having the same width and thickness as the elastic element 23, connecting the second contacting element 22 and the elastic element 23, and having an opening 26 penetrating therethrough in the through-thickness direction. The second contacting element 22 further projects from a width-direction outside end of the second connecting element 25 in the width direction. The conductive contact 2 is formed in a plate-like shape using a conductive material.

An insulating layer may be formed on a part or an entire surface of the conductive contact 2. Moreover, the first connecting element 24 and the second connecting element 25 may be different in width and/or thickness from those of the elastic element 23.

Figure 3:
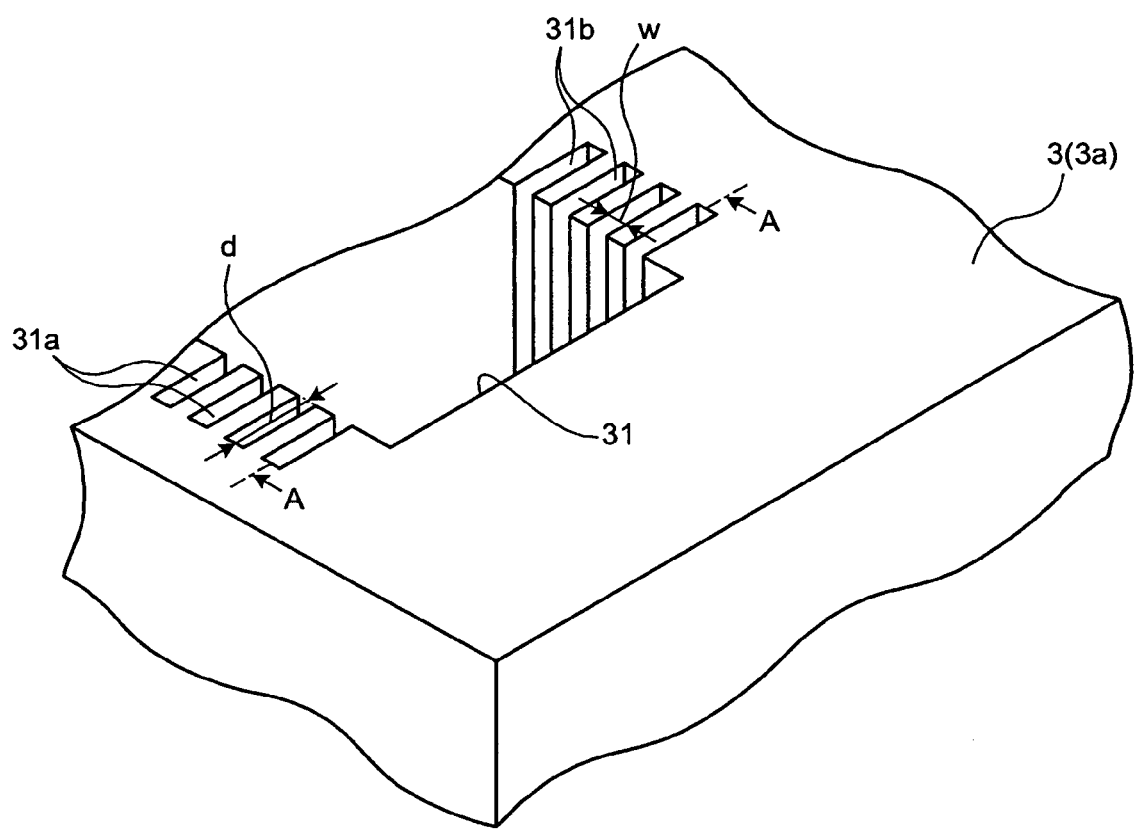
FIG. 3 is a partial enlarged perspective view of an upper wall of a conductive contact holder.

The conductive contact holder 3 will be now explained. As shown in FIG. 1, an external shape of the conductive contact holder 3 is approximately cubic. The conductive contact holder 3 includes: a supporting element 31 penetrating through an upper wall 3a and a bottom wall (not shown in FIG. 1) for supporting a plurality of the conductive contacts 2; and fastening holes 32 that face each other and are formed on a predetermined position on side walls 3b, respectively, through the supporting element 31 for fastening ends of the bar-shaped member 4. FIG. 3 is a partial enlarged perspective view of the upper wall 3a of the conductive contact holder 3. As shown in FIG. 3, the supporting element 31 includes a plurality of pairs of a linear first guiding groove 31a and a linear second guiding groove 31b. The first guiding groove 31a is engaged with and holds one of outside ends of the conductive contact 2 in the width direction in a slidable manner when the conductive contact 2 is mounted. The second guiding groove 31b, positioned facing the first guiding groove 31a, is engaged with and holds the other outside end of the conductive contact 2 that is embedded in the first guiding groove 31a in the width direction in a slidable manner. The first guiding grooves 31a and the second guiding grooves 31b that are formed in pairs, function to align the conductive contacts 2 in a planar direction intersecting perpendicularly with the longitudinal direction, and to guide the extending action of the conductive contacts 2. The adjacent pairs of the first guiding grooves 31a and the second guiding grooves 31b have the same intervals, and are positioned in parallel to each other.

Each of the first guiding grooves 31a and the second guiding grooves 31b has the same groove width (denoted as "w"), and the same groove depth (denoted as "d"). The groove depth is sufficient if the conductive contact 2 is held firmly without becoming loose. Therefore, in this sense, the groove depth of the first guiding groove 31a may be different from that of the second guiding groove 31b.

Figure 4:
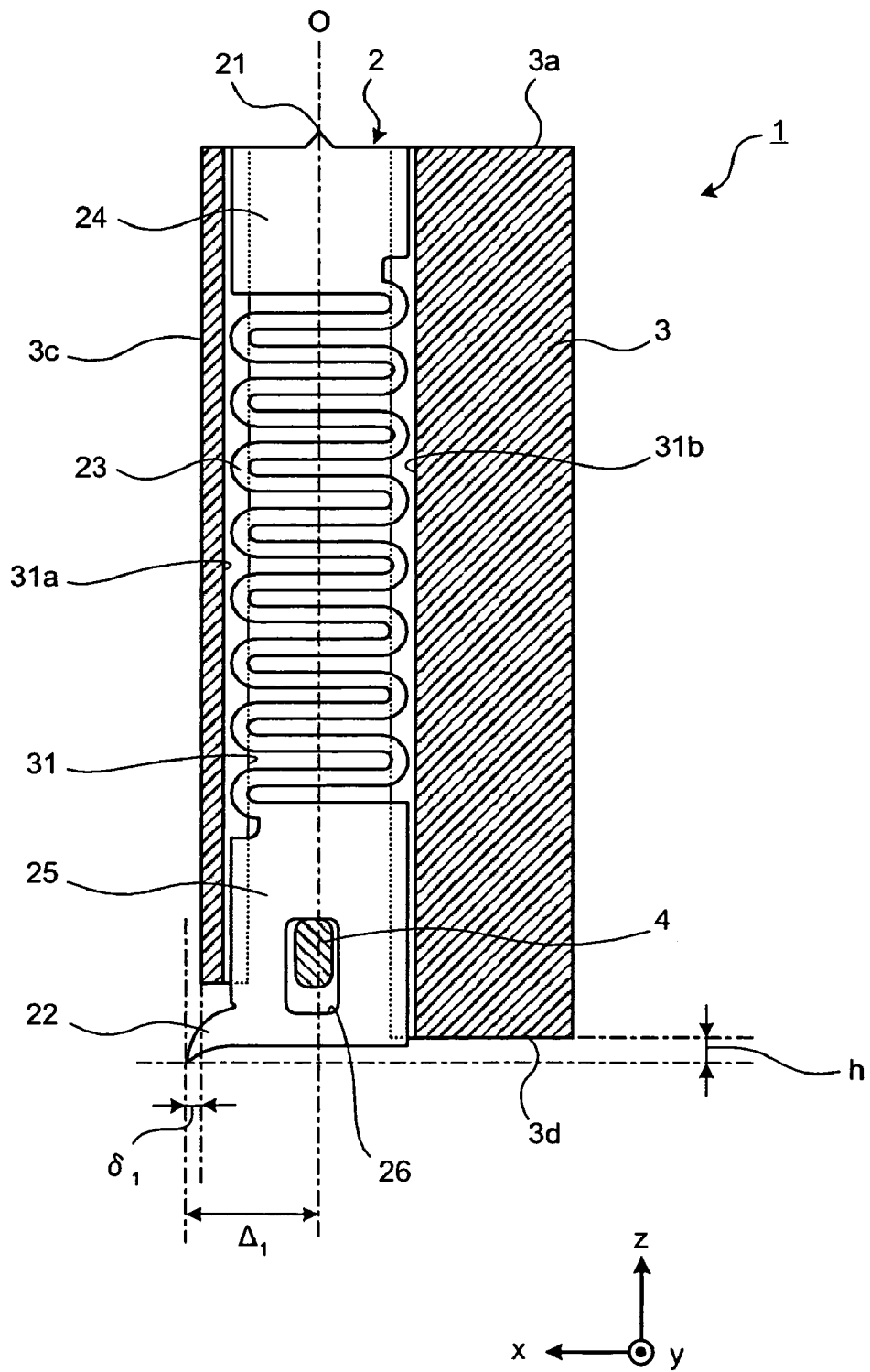
FIG. 4 is a diagram of an internal structure of the conductive contact unit according to the first embodiment.

FIG. 4 is a diagram of an internal structure of the conductive contact unit 1, including an internal structure of the supporting element 31 of the conductive contact holder 3. The conductive contact holder 3 shown in FIG. 4 corresponds to a cross section across a line A-A shown in FIG. 3. As shown in FIG. 4, the first guiding groove 31a and the second guiding groove 31b have structures that extend along a z axis (a direction perpendicular to the groove width direction), shown in FIG. 4, in parallel with each other. The first guiding groove 31a extends along the z axis direction shown in FIG. 4 for a length shorter than that the second guiding groove extends along the same z axis direction. The second guiding groove 31b extends up to a bottom wall 3d of the conductive contact holder 3; however, the first guiding groove 31a only extends up to a position above the bottom wall 3d in the vertical direction.

The conductive contact holder 3 having such a structure holds the conductive contacts 2 positioned with their width direction, with their through-thickness direction in parallel with a y axis, and with their longitudinal direction in parallel with the z axis direction, in parallel with an x axis in a coordinate system (xyz) shown in FIGS. 1 and 4. This means that the conductive contact 2 has a thickness slightly smaller than the groove width (w) of the first guiding groove 31a and the second guiding groove 31b. The longitudinal length of the conductive contact 2 is designed so that: the bar-shaped member 4 penetrates through the opening 26; a tip of the second contacting element 22 projects by a predetermined amount from a side wall 3c of the conductive contact holder 3 in the x axis direction (the projected length is denoted as "δ1") in a state applying no load to the first contacting element 21 and the second contacting element 22 (the state shown in FIG. 4); and the tip of the second contacting element 22 projects by a predetermined amount from the bottom wall 3d in a negative direction in z axis (the projected length is denoted as "h"). The second contacting element 22 is provided at a position offset by a predetermined distance (the offset is denoted as "$\Delta_1$") from a symmetric axis O that is in parallel with the longitudinal direction of the elastic element 23 or the first connecting element 24. The projected lengths δ1 and h, and the offset $\Delta_1$ are determined accordingly based on conditions such as a size of the conductive contact 2 or the conductive contact holder 3, or a load added to the test object.

The conductive contact holder 3 is preferably formed using an insulating material, from a view of preventing a short circuit caused by the conductive contact holder 3 electrically being connected to the conductive contacts 2. For example, the conductive contact holder 3 may be formed using a synthetic resin of low thermal expansion, and the first guiding grooves 31a and the second guiding grooves 31b may be formed thereon by dicing and the like. Alternatively, a base material for the conductive contact holder 3 may be formed using a ceramic such as alumina ($Al_2O_3$), zirconia ($ZrO_2$), or silica ($SiO_2$), a thermosetting resin such as a silicone, or an epoxy, an engineering plastic such as a polycarbonate or the like, and the first guiding grooves 31a and the second guiding grooves 31 may be formed with a processing technology such as etching. Alternatively, instead of using an insulating material for forming the conductive contact holder 3, other appropriate materials (regardless of the insulating property of the material) also can be used to form the base material and to apply an appropriate insulating coating over the areas that could possibly contact with the conductive contacts 2 (the area including the first guiding grooves 31a or the second guiding grooves 31b).

The bar-shaped member 4 mounts the conductive contacts 2 onto the supporting element 31. After inserting through the opening 26 of each of the conductive contacts 2, the both ends of the bar-shaped member 4 are inserted into the fastening holes 32, each of which is formed on the side walls 3b that face each other in the conductive contact holder 3, and the bar-shaped member 4 is fixed onto the conductive contact holder 3. The bar-shaped member 4 functions to prevent the conductive contacts 2 from being disengaged from the supporting element 31, by penetrating through all of the openings 26 of the conductive contacts 2 that are held in the supporting element 31, as well as to give an initial flexure to the conductive contacts 2.

A cross section of the bar-shaped member 4, sectioned in perpendicular with the longitudinal direction, has a rectangular shape with chamfered corners, and the area thereof is smaller than that of the opening 26 of the conductive contact 2. Such a cross-sectional shape enables a process, performed for forming the fastening holes 32 with respect to the conductive contacts 2, to be simplified. The above-described cross-sectional shape also enables the conductive contacts 2 to move smoothly when a load is applied to the conductive contacts 2, and ensures stability in supporting the bar-shaped member 4 when a predetermined load is applied to the conductive contacts 2. Moreover, when the test object is brought into contact with the conductive contacts 2, the opening 26 becomes separated from the bar-shaped member 4, enabling the opening 26 to move freely with respect to the bar-shaped member 4. As a result, the conductive contacts 2 can be rotated slightly, as will be described later.

The cross-sectional shape of the bar-shaped member 4, sectioned in perpendicular to the longitudinal direction, is not limited to the above, and may be a polygonal, a square, or a circle, for example. It should be needless to say that the shape of the fastening hole 32 is changed according to the cross-sectional shape of the bar-shaped member 4.

The bar-shaped member 4 having the above structure is also formed using an insulating material. Because this bar-shaped member 4 penetrates through the openings 26 of a number of the conductive contacts 2 to support all of the conductive contacts 2, the bar-shaped member 4 is preferably made of an insulating material such as a ceramic, with high rigidity, and with small flexure generated upon application of a load.

Figure 5:
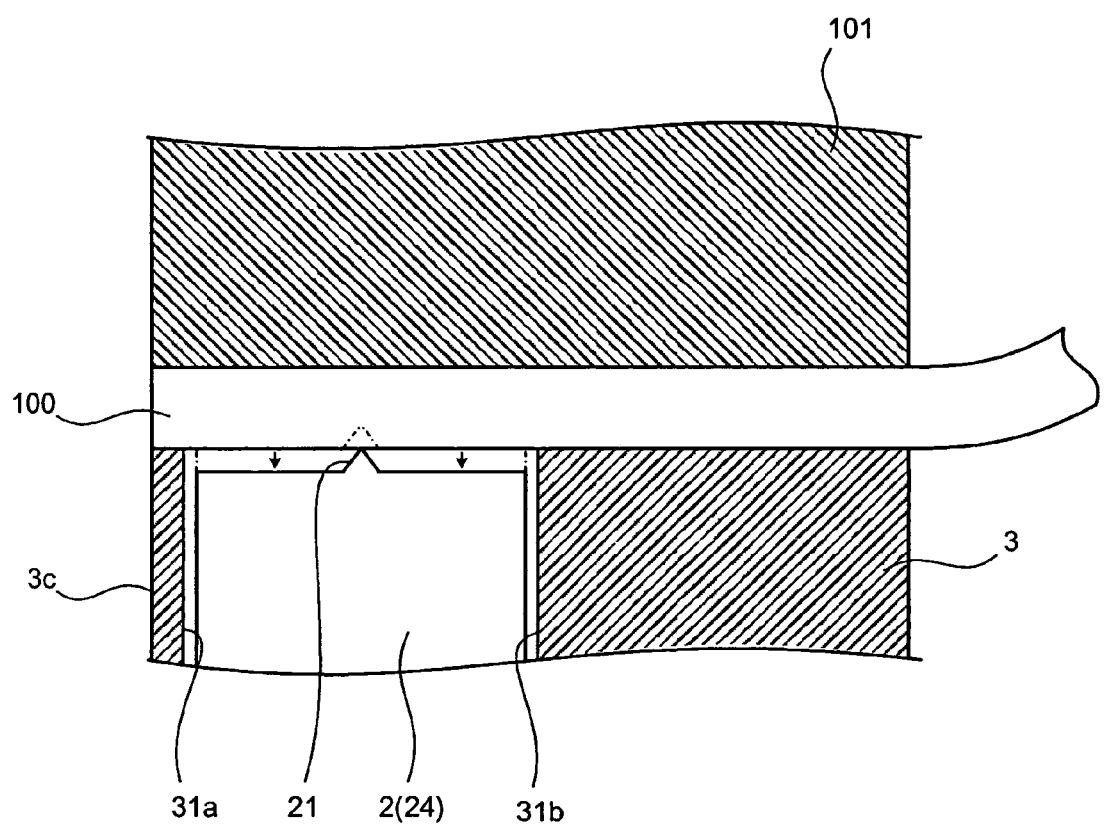
FIG. 5 is a partial enlarged view of an upper portion of the conductive contact holder attached with a circuit substrate that is connected to a test circuit.

FIG. 5 is a partial enlarged view of the upper portion of the conductive contact holder 3 attached with a circuit substrate for establishing an electrical connection with a signal processing circuit that generates and outputs a test signal. For the purpose of comparison, the position of the conductive contact 2 shown in FIG. 4 is indicated with a dotted line. A circuit substrate 100 shown in FIG. 5 has a plurality of wires and connecting electrodes, made of a material such as nickel, formed on one surface of the sheet-like substrate made of a material such as polyimide. FIG. 5 illustrates an arrangement where the electrodes of the circuit substrate 100 are aligned so as to be brought into contact with the first contacting elements 21 of the conductive contacts 2, and the circuit substrate 100 is held between the a fixing member 101, made of the same material as the conductive contact holder 3, and the conductive contact holder 3. To fix the circuit substrate 100 onto the conductive contact unit 1, the conductive contact holder 3 and the fixing member 101 may be fixed together with screws (not shown), for example. If the arrangement transits from the state shown in FIG. 4 to that shown in FIG. 5, a load (initial load), other than the gravity, acting upon the conductive contacts 2, is applied to each of the conductive contacts 2, shrinking each of the elastic elements 23 in the longitudinal direction.

The other end of the circuit substrate 100 is connected to the signal processing circuit (not shown) as described above, and transmits and receives an electrical signal to and from the test object that is in contact with the second contacting elements 22. In FIG. 5, the circuit substrate 100 is brought into contact with the conductive contacts 2; however, another configuration is possible where connecting terminals of a signal outputting circuit are directly brought into contact with the conductive contacts 2, instead.

In a known conductive contact unit, a plate-like covering member has been used for applying the initial load to the conductive contacts. However, when such a covering member is used, the contacting element located at the tip of the conductive contact needed to be projected further by a distance equal to the thickness of the covering member. Thus, it has been a problem that a greater area becomes unstable when the load is applied, and the area near the tip could become bent easily. Because the conductive contact unit 1 according to the first embodiment does not use the covering member, the problem is no longer occurring, and the size of the first contacting element 21 can be dramatically reduced in comparison with the known example.

Figures 1, 6:
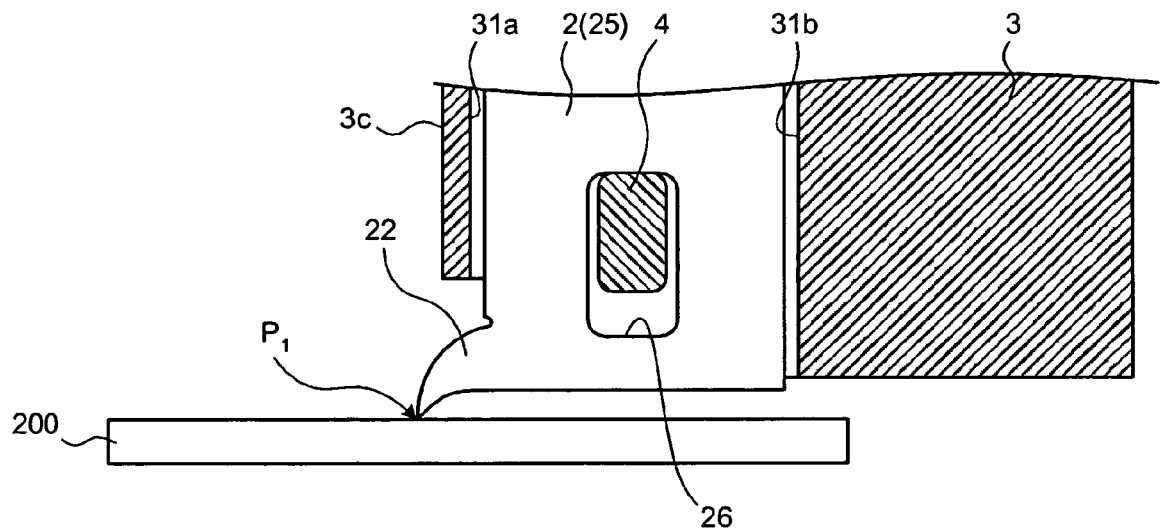
Figures 2, 6:
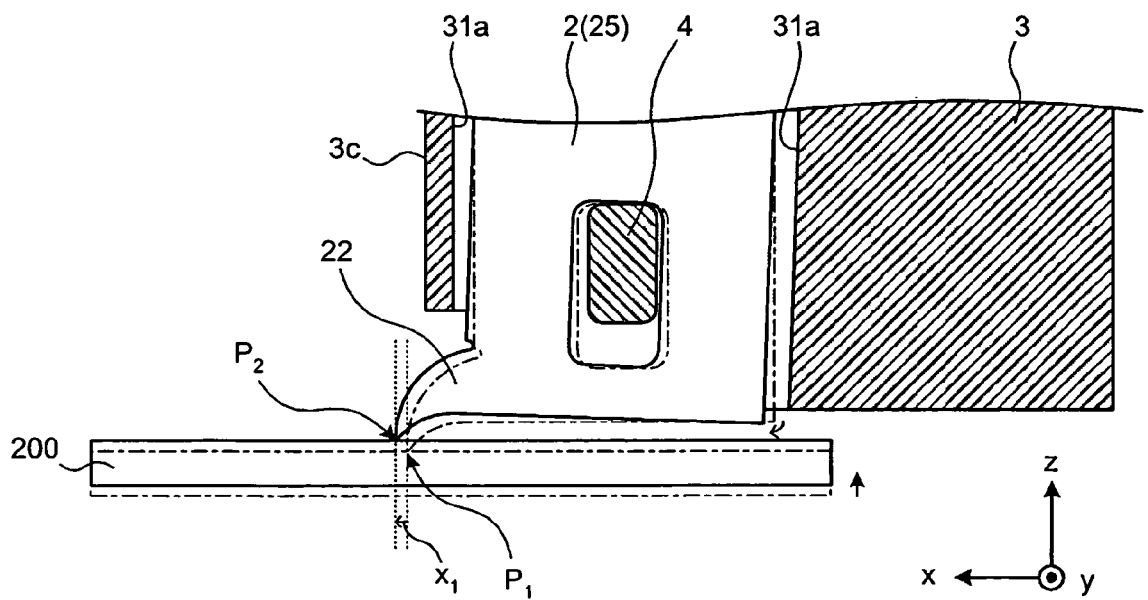

An illustrative embodiment of a contact between conductive contact unit 1 and the test object will be now explained. FIG. 6-1 is a diagram of an area near the bottom end of the conductive contact 2 immediately after a test object 200 is brought into contact with the second contacting elements 22 of the conductive contacts. FIG. 6-2 is a diagram of the area near the bottom end of the conductive contact 2 when the test object 200 is elevated to a test position. In FIG. 6-2, the position of the conductive contact 2 immediately after the contact is established is shown in dotted line for the purpose of comparison.

The tip of the second contacting element 22 is offset by $\delta_1$ from the longitudinal symmetric axis (central axis) O of the elastic element 23 or the first connecting element 24, as described above with reference to FIG. 4. Therefore, the line of action of the load acting upon the tip of the second contacting element 22 that is brought into contact with the test object 200 does not go through the center of gravity of the conductive contact 2. Thus, a moment is generated in the conductive contact 2. As a result, the elastic element 23 shrinks and the opening 26 is moved away from the bar-shaped member 4. Due to this moment, the conductive contact 2 rotates slightly, while the conductive contact 2 goes through the transition from the state shown in FIG. 6-1 to that shown in FIG. 6-2. This rotation is generated because a small gap is present between the outside end of the elastic element 23 and the first guiding groove 31a, and the other outside end thereof and the second guiding groove 31b, respectively, in the width direction.

Due to this rotation, the second contacting element 22 slightly rotates in a clockwise direction in FIG. 6-2, and moves along the surface of the test object 200 while keeping in contact with the test object 200. More specifically, the tip of the second contacting element 22 slides from an initial contact point $P_1$ to a final contacting point $P_2$, scratching the surface of the test object 200, to move in the x axis direction by a distance of $x_1$ (>0). In this manner, while the tip of the second contacting element 22 is moved on the surface of the test object 200, the oxidized film or dust accumulated to the surface thereof is removed, ensuring a stable electrical contact between the second contacting elements 22 and the test object 200. This is advantageous because, if the movement speed (elevating speed) of the test object 200 is controlled appropriately at this time, not only the surface of the test object 200 can be protected from being damaged greatly by the tips of the second contacting elements 22, but also the conductive contacts 2 can be prevented from being applied with an excessive load.

The conductive contact unit 1 described above holds the conductive contacts 2 by engaging parts of the conductive contacts 2 into the first guiding grooves 31a and the second guiding grooves 31b laid in the direction that the elastic element 23 of the conductive contacts 2 is extensible. Therefore, a problem of buckling or twisting due to the shrinkage of the elastic element 23, which is a problem unique to the plate-like conductive contact 2, can be prevented from occurring. Furthermore, the spring characteristic of the elastic element 23 can be prevented from deteriorating due to the problem such as above. In this manner, a large stroke can be achieved without causing buckling or twisting, even when a certain or more load within an appropriate range is applied to the conductive contact 2, and a desirable contact can be obtained between the second contacting elements 22 and the test object 200.

Moreover, in the conductive contact unit 1, the conductive contacts 2 are held by the first guiding grooves 31a and the second guiding grooves 31b. Therefore, it is possible to reduce a sliding resistance by reducing the area of the conductive contact 2 being in contact with (the supporting element 31 of) the conductive contact holder 3, enabling the conductive contacts 2 to be extended smoothly.

Furthermore, in the conductive contact unit 1, it is sufficient if the groove width (w) of the first guiding grooves 31a and the second guiding grooves 31b is approximately the same as the thickness of the conductive contacts 2. Moreover, each of the intervals between the adjacent first guiding grooves 31a or the adjacent second guiding grooves 31b can be reduced to a given small value, as long as the insulation between the adjacent conductive contacts 2 is ensured. Therefore, it is possible to reduce the arrangement intervals between the conductive contacts 2, and to support the small arrangement intervals between the connecting electrodes or terminals of the contacted circuitries.

In addition, in the conductive contact unit 1, the bar-shaped member 4 penetrates through the conductive contacts 2 to give the initial flexure onto the conductive contacts 2, as well as to prevent the conductive contacts 2 from being disengaged. As a result, it is possible to reduce the distance h of the tip of the second contacting element 22, that is, the lower end of the conductive contact 2 projecting in the vertical direction below the bottom wall 3d of the conductive contact holder 3. In other words, in the conductive contact unit 1, because the size of the second contacting element 22 can be reduced, the tip of the conductive contact 2 can be prevented from being bent, and the conductive contacts 2 can be supported in a stable manner. Thus, the conductive contacts 2 can be prevented from being disengaged from the first guiding grooves 31a and/or the second guiding grooves 31b near the bottom area thereof. As a result, a position precision of the conductive contacts 2 can be improved, and reliability and durability of the conductive contact unit 1 can be also improved.

When the conductive contact unit 1 is assembled, a process for putting the conductive contacts 2 into the supporting element 31 is completed by inserting the conductive contact 2 into the supporting element 31 from the side of the first contacting element 21, and by engaging the width-direction outside ends into the first guiding groove 31a and the second guiding groove 31b. Therefore, the assembly is easier in comparison with the known conductive contact unit. Moreover, the production cost can be advantageously reduced.

In the conductive contact unit according to the first embodiment of the present invention as described above, the conductive contact unit includes: the conductive contact holder further including a plurality of the first guiding grooves each of which is engaged with and holds one of the outside ends of the contained conductive contact in the longitudinal direction in a slidable manner, and a plurality of the second guiding grooves each of which faces the first guiding groove, and is engaged with and holds the other outside end of the conductive contact that is embedded in the first guiding groove in a slidable manner; a plurality of the plate-like conductive contacts, each of which further including: the first contacting element that is brought into physical contact with one of the different circuitries, the second contacting element that is brought into physical contact with one of the different circuitries other than that brought into contact with the first contacting element, the elastic element that is interposed between the first contacting element and the second contacting element, and is extensible in the longitudinal direction, the first connecting element that connects the elastic element and the first contacting element, and the second connecting element that connects the elastic element and the second contacting element, that has an opening penetrating therethrough in a thickness direction, and that projects from the end of the second guiding groove toward outside of the conductive contact holder when the conductive contact is held inside the conductive contact holder; and the bar-shaped member penetrating through the openings each of which is formed on the second connecting element of each of the conductive contacts, and being fixed onto the conductive contact holder. Furthermore, at least a part of the second contacting element projects from an outside surface of the conductive contact holder in a normal direction of the external surface in a region of the external surface inside of which the first guiding grooves are formed. In this manner, the smaller arrangement intervals can be supported, and the contact with the test object can be visually checked from the top easily. Moreover, a stable electrical contact can be achieved without applying an excessive load.

Furthermore, the conductive contact according to the first embodiment includes the first contacting element that is brought into physical contact with one of the different circuitries; the second contacting element that is brought into physical contact with one of the different circuitries other than that brought into contact with the first contacting element; the elastic element that is interposed between the first contacting element and the second contacting element, and is extensible in the longitudinal direction; the first connecting element that connects the elastic element and the first contacting element; and the second connecting element that connects the elastic element and the second contacting element that connects the elastic element and the second contacting element, that has an opening penetrating therethrough in the thickness direction, and that further projects from a width-direction outside end of the second connecting element in the width direction. In this manner, the smaller arrangement intervals can be supported, and the contact with the test object can be visually checked from the top easily with the conductive contacts held in the conductive contact holder. Moreover, a stable electrical contact can be achieved without applying an excessive load.

As described above, according to the first embodiment, when an actual test is performed, the operator can easily make an observation visually or with a microscope from the top of the conductive contact unit. The operator can perform the test while checking the physical contact between the tip of the conductive contact and the test object. Therefore, the operator no longer needs to bend over to observe the contact between the conductive contact and the test object. Thus, workability and reliability of the test can be further improved, as well as the physical burden of the operator can be reduced.

An example of the conductive contact unit 1, suitable with the test object 200 being a liquid crystal panel, will be now explained. In this example, the thickness of the conductive contact 2 was set to 20 micrometers, the width thereof was set to 2.7 millimeters, and the length thereof was set to 15 millimeters. The conductive contact holder 3 could contain approximately 400 of the conductive contacts 2 having the dimensions described above. The groove width w of the first guiding grooves 31a and the second guiding grooves 31b were set to be 30 micrometers, and the groove depth d thereof was set to be 150 micrometers. The entire length of the bar-shaped member 4 was set to approximately 28 millimeters, and the cross-sectional shape thereof, sectioned perpendicular to the longitudinal direction, was an approximate rectangle of 0.8 millimeters×1.5 millimeters (with corners chamfered). The projected length $\delta_1$ of the tip of the second contacting element 22 projecting from the side wall 3c was set to be 0.4 millimeters. The offset $\Delta_1$ of the second contacting element 22 being offset from the symmetric axis of the elastic element 23 and the first connecting element 24 was set to be 2.2 millimeters. The projected length h of the tip of the second contacting element 22 projecting from the bottom wall 3d of the conductive contact holder 3 was set to be 0.4 millimeters.

By providing the conductive contact unit 2 in the manner described above, the spring constant of the conductive contact 2 could be set to approximately 0.01 g/µm generating a load of 5 grams with a flexure of 500 micrometers. These values are approximately equal to those of a pin-type conductive contact, achieving a quite large load and stroke for the conductive contact 2 having the shape of a thin plate. When the conductive contacts 2 were brought into contact with the test object 200, using the conductive contact unit 1 having the dimensions described above, and a predetermined load were applied, a scratch, approximately 70 micrometers in size, was formed on the surface of the test object 200. This result proved that it was possible to remove the oxidized film or accumulated dust on the surface of the test object 200 precisely, without damaging the surface thereof excessively.

Second Embodiment

Figure 7:
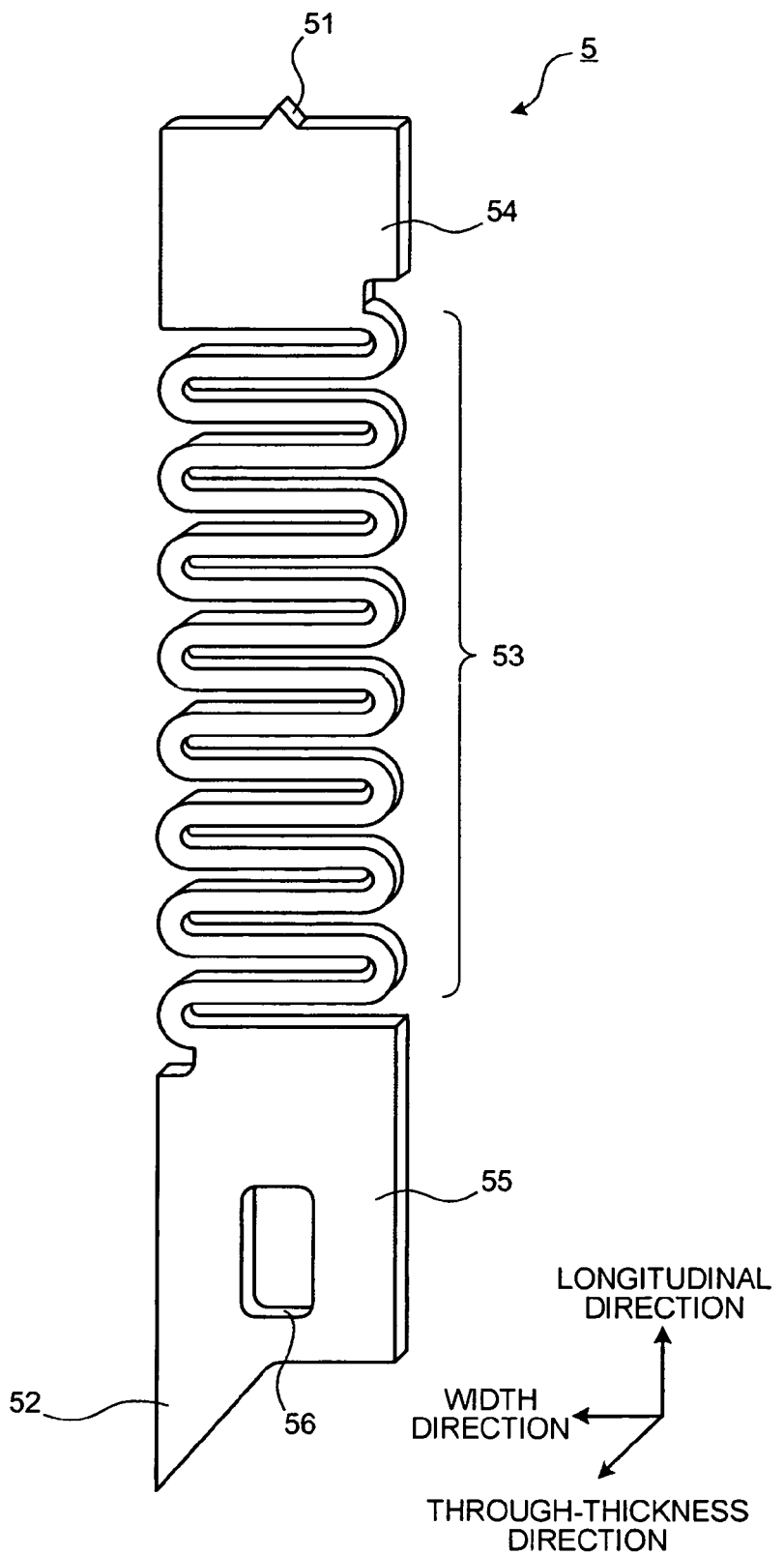
FIG. 7 is a diagram of a structure of a conductive contact according to a second embodiment of the present invention.

FIG. 7 is a diagram of a structure of a conductive contact according to a second embodiment of the present invention. In the following description, the vertical direction in FIG. 7 will be referred to as a "longitudinal direction of a conductive contact 5", the horizontal direction in FIG. 7 will be referred to as a "width direction of the conductive contact 5", and the direction intersecting with the longitudinal direction and the width direction will be referred to as a "through-thickness (thickness) direction of the conductive contact 5", respectively.

The conductive contact 5 shown in FIG. 7 is provided to establish an electrical connection between different circuitries. The conductive contact 5 includes: a first contacting element 51 that is brought into physical contact with a predetermined circuitry (specifically, a circuitry including a test circuit); a second contacting element 52 that is brought into physical contact with a circuitry other than that brought into contact with the first contacting element 51 (specifically, a test object such as a liquid crystal display); an elastic element 53 that is interposed between the first contacting element 51 and the second contacting element 52, and extensible in the longitudinal direction; a first connecting element 54 having the same width and thickness as the elastic element 53, and connecting the first contacting element 51 and the elastic element 53; and a second connecting element 55 having the same width and thickness as the elastic element 53, connecting the second contacting element 52 and the elastic element 53, and having an opening 56 penetrating therethrough in the through-thickness direction. The conductive contact 5 is formed in a plate-like shape using a conductive material. The shapes of each of the elements, except for the second contacting element 52 and the second connecting element 55, are same as those corresponding elements in the conductive contact 2 according to the first embodiment.

In the conductive contact 5, the tip of the second contacting element 52 is formed at the dead end of the width-length outside end that extends from the first connecting element 54 to the second connecting element 55 across the elastic element 53 (the lowermost end in FIG. 7). In this sense, the second contacting element 52 does not project from the second connecting element 55 of the conductive contact 5 according to the second embodiment.

Figure 8:
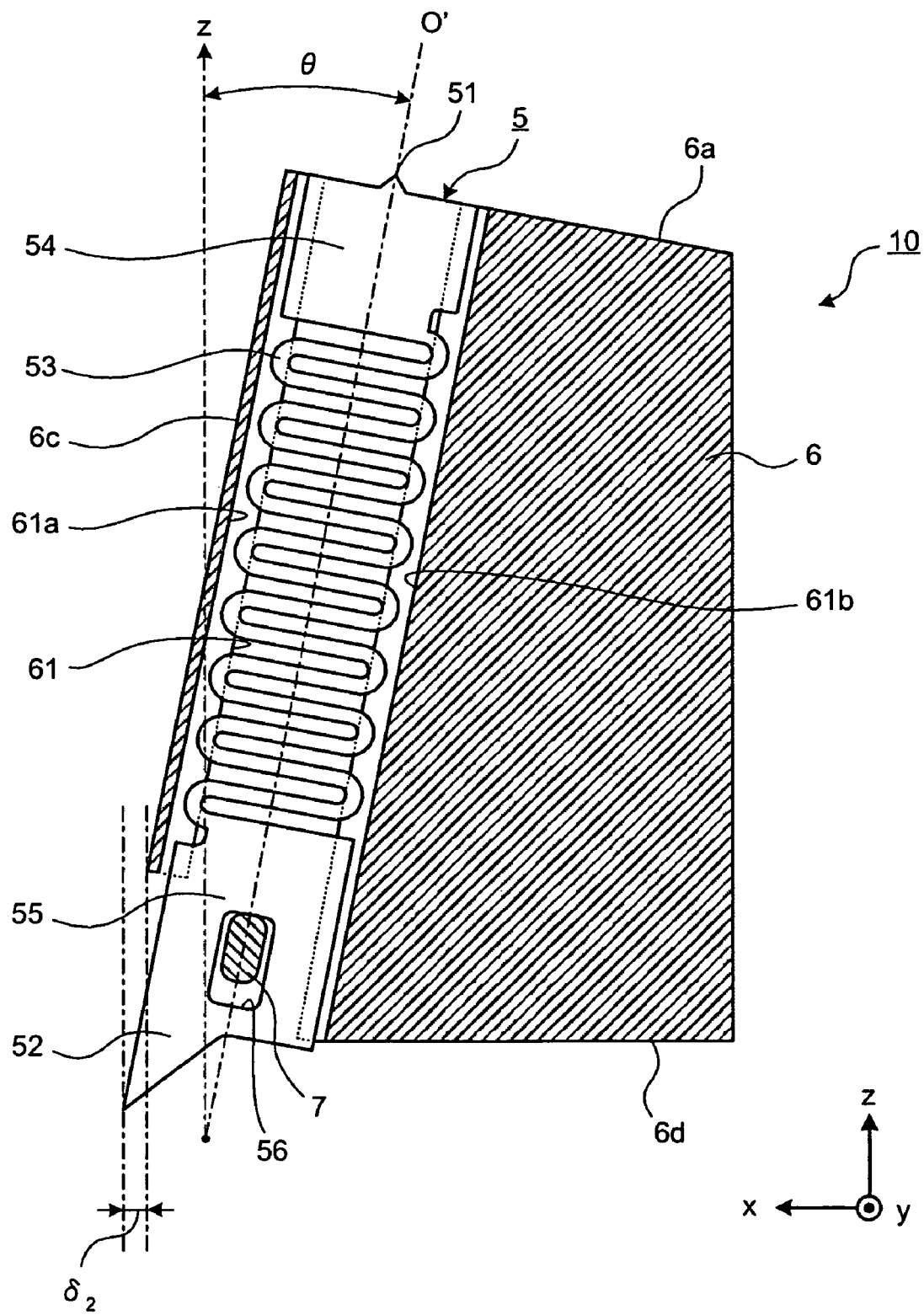
FIG. 8 is a diagram of an internal structure of a conductive contact unit according to the second embodiment.

FIG. 8 is a diagram of a structure of a conductive contact unit according to the second embodiment. A conductive contact unit 10, shown in FIG. 8, is used for testing the conductive state or testing the operating characteristics of a circuitry, such as a liquid crystal panel that is a test object. The conductive contact unit 10 includes a plurality of the conductive contacts 5 having the structure described above, a conductive contact holder 6 that contains and holds the conductive contacts 5, and a bar-shaped member 7 penetrating through the openings 56 formed on the conductive contacts 5, having a smaller cross-sectional area, sectioned in perpendicular to the longitudinal direction, than the opening 56, and having both ends thereof being fixed to the conductive contact holder 6.

The conductive contact holder 6 has a supporting element 61 penetrating through inside the conductive contact holder 6 in a predetermined direction from an upper wall 6a, for supporting a plurality of conductive contacts 5. This supporting element 61 penetrates in a direction angled by a predetermined angle θ with respect to the vertical direction (z axis direction) in FIG. 8. In other words, the direction of a symmetric axis (central axis) O' of the first contacting element 51 and the elastic element 53 of the conductive contact 5, supported in the conductive contact holder 6, is tilted by the angle θ with respect to the z axis in the FIG. 8. Approximately 1 degree is sufficient for this tilted angle θ.

The supporting element 61 includes a plurality of pairs of a linear first guiding groove 61a and a linear second guiding groove 61b. The first guiding groove 61a is engaged with and holds one of the outside ends of the conductive contact 5 in the width direction in a slidable manner when the conductive contact 5 is mounted. The second guiding groove 61b, positioned facing the first guiding groove 61a, is engaged with and holds the other outside end of the conductive contact 5 that is embedded in the first guiding groove 61a in the width direction in a slidable manner. The bottom of the second guiding groove 61 extends in a direction that is longer than that of the first guiding groove 61a. The first guiding grooves 61a and the second guiding grooves 61b that are formed in pairs, function to align the conductive contacts 5 in a direction of a plane intersecting perpendicularly with the longitudinal direction, and to guide the extending action of the conductive contacts 5. The adjacent pairs of the first guiding grooves 61a and the second guiding grooves 61b have the same intervals, and are parallel to each other. Although not shown, the conductive contact holder 6 also has fastening holes for allowing the bar-shaped member 7 to penetrate therethrough for fastening the bar-shaped member 7, in the same manner as in the conductive contact holder 3 according to the first embodiment.

The conductive contact unit 10 having the structure described above is aligned with respect to the test object so that, when the second contacting element 52 is brought into physical contact with the test object, a load is applied to the second contacting element 52 in a direction (z axis direction in FIG. 8) that intersects with the direction of the first guiding groove 61a and the second guiding groove 61b by an angle θ (>0). Therefore, the tip of the second contacting element 52 projects from a side wall 6c, which is an external surface on the side of the first guiding groove 61a, in the x axis direction (the projected length is denoted as "$\delta_2$".) Therefore, the operator can see the tip of the second contacting element 52 from the oblique upper left side of FIG. 8, allowing the operator to easily observe the contact between the tip of the conductive contact 5 and the test object. Therefore, the operator no longer needs to bend over to observe the contact in a test.

Figure 9:
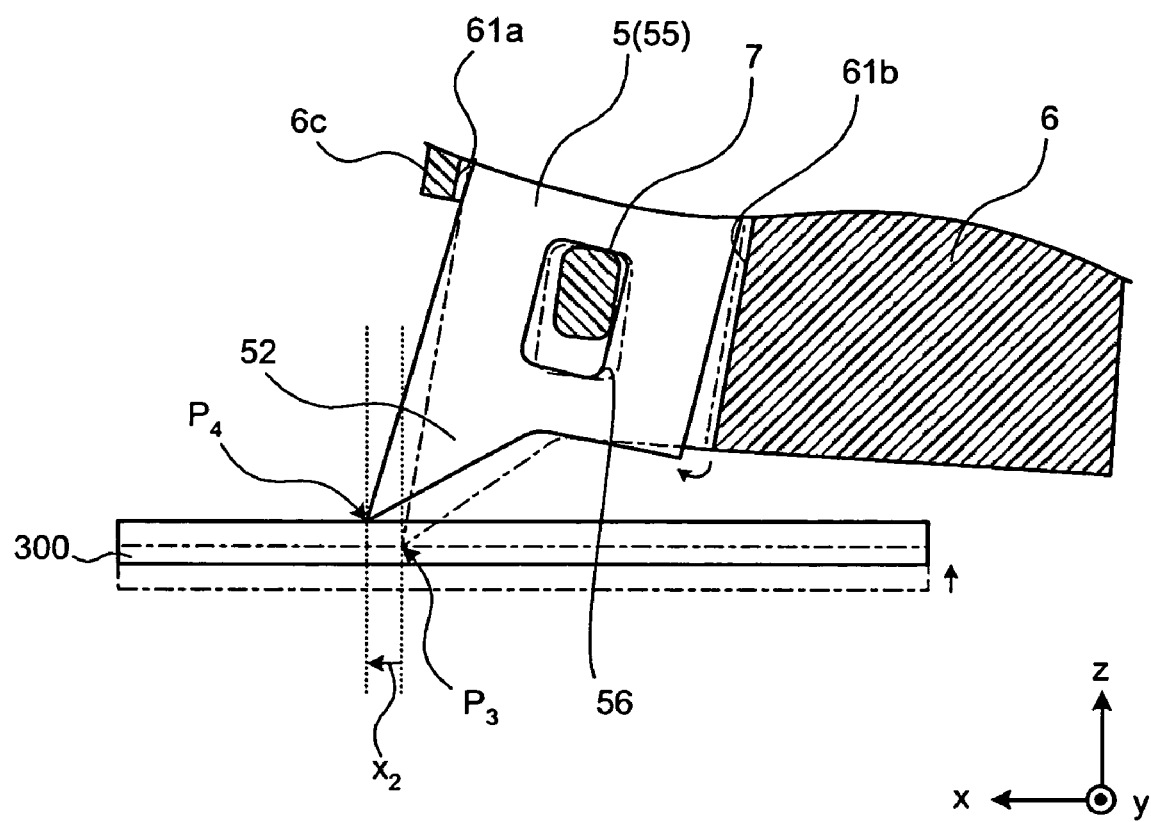
FIG. 9 is a diagram of the conductive contact unit according to the second embodiment with a test object elevated to a test position.

FIG. 9 is a diagram of the conductive contact unit 10 brought into contact with a test object 300. In FIG. 9, the bottom area shown in FIG. 8 is enlarged, and the test object 300, immediately after being brought into contact with the tip of the second contacting element 52, is shown in a dotted line for the purpose of comparison. In this sense, FIG. 9 is a diagram that corresponds to FIG. 6-2.

As shown in FIG. 9, when the test object 300 is elevated closer to the bottom wall 6d along the z axis direction, and the test object 300 is brought into contact with the tip of the second contacting element 52, the tip of the second contacting element 52 is applied with a load having a direction of the z axis in FIG. 9. (In other words, the second contacting element 52 applies a load to the test object 300 in a negative direction on the z axis in FIG. 9). The line of action of this load does not pass through the center of gravity of the conductive contact 5. Therefore, a moment is generated in the conductive contact 5. As a result, the elastic element 53 shrinks and the opening 56 is moved away from the bar-shaped member 7, which is applied with the load from the test object 300. Due to this moment, the conductive contact 5 rotates slightly, and is moved in the x axis direction along the surface of the test object 300.

Due to this rotation, the second contacting element 52 slightly rotates in a clockwise direction in FIG. 9, scratching the surface of the test object 300, and moves from an initial contact point $P_3$ to a final contacting point $P_4$ in the x axis direction by a distance of $x_2$ (>0). Therefore, it becomes possible to remove the oxidized film or dust accumulated to the surface of the test object 300, while ensuring a stable electrical contact between the second contacting element 52 and the test object 300. Moreover, in the second embodiment, it is advantageous because, if the movement speed (elevating speed) of the test object 300 is controlled appropriately, not only the surface of the test object 300 can be protected from being damaged greatly by the tips of the second contacting elements 52, but also the conductive contacts 5 can be prevented from being applied with an excessive load.

The conductive contact 5 is made of a conductive material, in the same manner as that according to the first embodiment. The conductive contact holder 6 and the bar-shaped member 7 are made of an insulating material, in the same manner as in those according to the first embodiment.

The conductive contact unit according to the second embodiment of the present invention as described above includes: a conductive contact holder including: a plurality of the first guiding grooves each of which is engaged with and holds one of outside ends of the conductive contact in a longitudinal direction in a slidable manner, and a plurality of the second guiding grooves each of which faces the first guiding groove, and is engaged with and holds the other outside end of the conductive contact that is embedded in the first guiding groove in a slidable manner; a plurality of the plate-like conductive contacts, each of which including the first contacting element that is brought into physical contact with one of the different circuitries, the second contacting element that is brought into physical contact with one of the different circuitries other than that brought into contact with the first contacting element, the elastic element that is interposed between the first contacting element and the second contacting element, and is extensible in the longitudinal direction, the first connecting element that connects the elastic element and the first contacting element, and the second connecting element that connects the elastic element and the second contacting element, that has an opening penetrating therethrough in a thickness direction, and that projects from the end of the second guiding groove toward outside of the conductive contact holder when the conductive contact is contained inside the conductive contact holder; and the bar-shaped member that penetrates through the openings each of which is formed on the second connecting element of each of the conductive contacts, and is fixed onto the conductive contact holder. Furthermore, when the second contacting elements are brought into physical contact with any one of the different circuitries, the load is applied to the second contacting elements in a direction intersecting with the first guiding grooves and the second guiding grooves. In this manner, the smaller arrangement intervals can be supported, and the contact with the test object can be visually checked from the top easily. Moreover, a stable electrical contact can be achieved without applying an excessive load.

Moreover, in the second embodiment, when an actual test is performed, the operator can easily make an observation visually or with a microscope from the top of the conductive contact unit. The operator can perform a test while checking the physical contact between the tip of the conductive contact and the test object. Therefore, the operator no longer needs to bend over to observe the contact between the conductive contact and the test object. Thus, workability and reliability of the test can be further improved, as well as the physical burden to the operator can be reduced.

Other Embodiments

The first and the second embodiments are described above in detail as best mode for carrying out the present invention. However, the present invention is not intended to be limited only to these two embodiments. For example, the conductive contact according to the first embodiment can be also contained and held in the conductive contact holder according to the second embodiment to achieve a conductive contact unit.

The shape of the second contacting element of the conductive contact should be decided depending on various conditions, such as the material used for the conductive contacts, the shape of the conductive contact holder that contains and holds the conductive contacts, the load that should be applied to the conductive contact holder, and a type of the test object. The detailed shape of the second contacting element may be modified appropriately as long as it has the technical characteristics of the present invention.

Furthermore, in addition to the test of the liquid crystal panel, the conductive contact unit according to embodiments of the present invention can be also applied to a test of a package board mounted with a semiconductor chip, or a high density probe unit used for performing a wafer-level test.

As described above, the present invention may include various embodiments that are not described herein, and various design modifications and alike can be provided within the scope of the technological concept defined by the claims.

The conductive contact unit and the conductive contact according to embodiments of the present invention are useful for testing a conductive state or testing operating characteristics of an electronic component, such as a liquid crystal panel or a semiconductor integrated circuit.

The invention claimed is:

1. A conductive contact unit, comprising:
a plurality of plate-like conductive contacts for electrically connecting different circuitries, each conductive contact including a first contacting element to be brought in physical contact with one circuitry, a second contacting element to be brought in physical contact with another circuitry, an elastic element that is between the first contacting element and the second contacting element and is extensible in a longitudinal direction thereof, a first connecting element that connects the elastic element and the first contacting element, and a second connecting element that connects the elastic element and the second contacting element and that has an opening penetrating therethrough in a thickness direction;
a conductive contact holder including a plurality of first guiding grooves and a plurality of second guiding grooves facing the first guiding grooves, the conductive contact holder holding the conductive contacts with both longitudinal outside ends of each conductive contact being slidably engaged with the first guiding groove and the second guiding groove, the second connecting element of the conductive contact projecting from a bottom end of the second guiding groove toward outside of the conductive contact holder; and
a bar-shaped member that penetrates through the openings of the respective second connecting elements of the conductive contacts, and is fixed onto the conductive contact holder, wherein
the conductive contacts are slidably engaged with the first guiding grooves and the second guiding grooves such that the second contacting element rotates when a tip of the second contacting element is brought into contact with a surface of a test object and a load acts on the second contacting element.

2. The conductive contact unit according to claim 1, wherein at least a part of the second contacting element projects from an external surface of a side wall of the conductive contact holder in a normal direction of the external surface, the first guiding grooves being formed inside of the side wall.

3. The conductive contact unit according to claim 1, wherein a direction of the load intersects a direction in which the first guiding grooves and the second guiding grooves extend.

4. The conductive contact unit according to claim 1, wherein a cross-sectional area of the bar-shaped member, sectioned in perpendicular to a longitudinal direction thereof, is smaller than an area of the opening formed on the conductive contact.

* * * * *